(12) United States Patent
Ma et al.

(10) Patent No.: US 7,110,637 B2
(45) Date of Patent: Sep. 19, 2006

(54) TWO-STEP ELECTRODE FOR MEMS MICROMIRRORS

(75) Inventors: Yuan Ma, Nepean (CA); Mohiuddin Mala, Kanata (CA); John Michael Miller, Aylmer (CA)

(73) Assignee: JDS Uniphase Inc., Ottawa (CA)

( * ) Notice: Subject to any disclaimer, the term of this patent is extended or adjusted under 35 U.S.C. 154(b) by 0 days.

(21) Appl. No.: 10/944,840

(22) Filed: Sep. 21, 2004

(65) Prior Publication Data
US 2005/0089267 A1 Apr. 28, 2005

Related U.S. Application Data

(63) Continuation-in-part of application No. 10/445,360, filed on May 27, 2003, now Pat. No. 6,934,439.

(60) Provisional application No. 60/558,563, filed on Apr. 2, 2004, provisional application No. 60/537,012, filed on Jan. 20, 2004, provisional application No. 60/504,210, filed on Sep. 22, 2003, provisional application No. 60/479,222, filed on Jun. 18, 2003, provisional application No. 60/383,106, filed on May 28, 2002.

(51) Int. Cl.
*G02B 6/35* (2006.01)
*G02B 26/08* (2006.01)

(52) U.S. Cl. .................. 385/18; 359/223; 359/225

(58) Field of Classification Search .................. None
See application file for complete search history.

(56) References Cited

U.S. PATENT DOCUMENTS 6,037,719 A * 3/2000 Yap et al. ................ 315/169.3
6,327,855 B1 12/2001 Hill et al.
6,442,307 B1 * 8/2002 Carr et al. ................... 385/18
6,454,421 B1 9/2002 Yu et al.
6,491,404 B1 12/2002 Hill
6,529,652 B1 3/2003 Brener
6,533,947 B1 3/2003 Nasiri et al.
6,535,319 B1 3/2003 Buzzetta et al.
6,760,143 B1 * 7/2004 Yoon ........................ 359/290
6,894,819 B1 * 5/2005 Yoon ........................ 359/224
2002/0097952 A1 7/2002 Jin et al.
2002/0122217 A1 9/2002 Nakajima
2002/0126455 A1 9/2002 Wood
2003/0012486 A1 1/2003 Ducellier et al.
2003/0035192 A1 2/2003 Mizuno et al.
2003/0052569 A1 3/2003 Dhuler et al.

FOREIGN PATENT DOCUMENTS

WO    WO01/61400    8/2001
WO    WO01/73934    10/2001

* cited by examiner

*Primary Examiner*—John D. Lee
*Assistant Examiner*—Omar Rojas
(74) *Attorney, Agent, or Firm*—Teitelbaum & MacLean; Neil Teitelbaum; Doug MacLean

(57) ABSTRACT

A "piano"-style MEMs device includes an elongated platform pivotally mounted proximate the middle thereof by a torsional hinge. The middle portion of the platform and the torsional hinge have a combined width less than the width of the rest of the platform, whereby several of these "piano" MEMs devices can be positioned adjacent each other pivotally mounted about the same axis with only a relatively small air gap therebetween. In a preferred embodiment the range of angular motion of a MEMs device's platform is increased by reducing the field strength, i.e. the force per unit area, that is sensed at the outer free ends of the platform. Ideally two-step electrodes are provided with a lower step positioned beneath the outer free end of the platform.

20 Claims, 17 Drawing Sheets

US 7,110,637 B2

TWO-STEP ELECTRODE FOR MEMS MICROMIRRORS

CROSS-REFERENCE TO RELATED APPLICATIONS

The present invention is a continuation-in-part of U.S. patent application Ser. No. 10/445,360 filed May 27, 2003, now U.S. Pat. No. 6,934,439 which claims priority from U.S. Patent Application Ser. No. 60/383,106 filed May 28, 2002, which are both incorporated herein by reference. The present invention also claims priority from U.S. Patent Applications Ser. Nos. 60/479,222 filed Jun. 18, 2003, 60/504,210 filed Sep. 22, 2003, 60/537,012 filed Jan. 20, 2004, 60/558,563 filed Apr. 2, 2004, Ser. No. 10/850,407 and 10/850,424 both filed May 21, 2004, which are all incorporated herein by reference.

TECHNICAL FIELD

The present invention relates to a micro-electro-mechanical (MEMs) device including an array of tilting platforms actuated by electrodes, and in particular to a MEMs mirror array with two-step electrodes to prevent angular instability of the mirrors.

BACKGROUND OF THE INVENTION

Conventional MEMs mirrors used in optical switches, such as the one disclosed in U.S. Pat. No. 6,535,319 issued Mar. 18, 2003 to Buzzetta et al, for redirecting beams of light to one of a plurality of output ports, include an electrostatically controlled mirror pivotable about a single axis. Tilting MEMs mirrors, such as the ones disclosed in U.S. Pat. No. 6,491,404 issued Dec. 10, 2002 in the name of Edward Hill, and U.S. Patent Publication No. 2003/0052569, published Mar. 20, 2003 in the name of Dhuler et al, which are incorporated herein by reference, comprise a mirror pivotable about a central longitudinal axis. The MEMs mirror device 1, disclosed in the aforementioned Hill patent, is illustrated in FIG. 1, and includes a rectangular planar surface 2 pivotally mounted by torsional hinges 4 and 5 to anchor posts 7 and 8, respectively, above a substrate 9. The torsional hinges may take the form of serpentine hinges, which are disclosed in U.S. Pat. No. 6,327,855 issued Dec. 11, 2001 in the name of Hill et al, and in U.S. Patent Publication No. 2002/0126455 published Sep. 12, 2002 in the name of Robert Wood, which are incorporated herein by reference. In order to position conventional MEMs mirror devices in close proximity, i.e. with a high fill factor (fill factor=width/pitch), they must be positioned with their axes of rotation parallel to each other. Unfortunately, this mirror construction restraint greatly restricts other design choices that have to be made in building the overall switch.

When using a conventional MEMs arrangement, the mirror 1 positioned on the planar surface 2 can be rotated through positive and negative angles, e.g. ±2°, by attracting one side 10a or the other side 10b of the planar surface 2 towards the substrate 6. Unfortunately, when the device is switched between ports at the extremes of the devices rotational path, the intermediate ports receive light for fractions of a millisecond as the mirror 1 sweeps the optical beam past these ports, thereby causing undesirable optical transient or dynamic cross-talk.

One solution to the problem of dynamic cross-talk is to initially or simultaneously rotate the mirror about a second axis, thereby avoiding the intermediate ports. An example of a MEMs mirror device pivotable about two axes is illustrated in FIG. 2, and includes a mirror platform 11 pivotally mounted by a first pair of torsion springs 12 and 13 to an external gimbal ring 14, which is in turn pivotally mounted to a substrate 16 by a second pair of torsion springs 17 and 18. Examples of external gimbal devices are disclosed in U.S. Pat. No. 6,529,652 issued Mar. 4, 2003 to Brenner, and U.S. Pat. No. 6,454,421 issued Sep. 24, 2002 to Yu et al. Unfortunately, an external gimbal ring greatly limits the number of mirrors that can be arranged in a given area and the relative proximity thereof, i.e. the fill factor. Moreover, the external gimbal ring may cause unwanted reflections from light reflecting off the support frame 13, 14.

Another proposed solution to the problem uses high fill factor mirrors, such as the ones disclosed in U.S. Pat. No. 6,533,947 issued Mar. 18, 2003 to Nasiri et al, which include hinges hidden beneath the mirror platform. Unfortunately, these types of mirror devices require costly multi-step fabrication processes, which increase costs and result in low yields.

The solution to overcome the shortcomings of the prior art proposed by the inventors of the parent application listed above is to provide a high fill factor MEMs mirror device that can pivot about the same axis as an adjacent mirror. In a preferred embodiment the MEMs mirror device is relatively easy to fabricate, with an internal gimbal ring and applicable in high fill factor applications.

Typically MEMs devices are independently actuated by an electrode mounted on the substrate below the tilting platform for inducing a voltage-controlled rotation via an electrostatic torque. In open loop configuration, the angular position of the platforms depend non-linearly on the voltage applied by the electrodes, i.e. as the applied voltage is increased linearly, the incremental change in angular platform position is greater as the voltage increases. Accordingly, there is a maximum voltage, i.e. an angular platform position, at which the platform angular position becomes unstable and will uncontrollably tilt until hitting part of the lower structure. This maximum voltage sets the range of angular motion that the platform can travel. The instability in the platform's angular position is a result of the distance between the platform and the electrode (the hot electrode) decreasing more rapidly at the outer free ends of the platform than at the inner sections, nearer the pivot axis $\theta_y$. As a result, the force per unit length along the platform increases more rapidly at the outer free ends of the platform than the inner sections.

An object of the present invention is to overcome the shortcomings of the prior art by increasing the range of angular motion of a MEMs device's platform by reducing the field strength, i.e. the force per unit area, that is sensed at the outer free ends of the platform.

SUMMARY OF THE INVENTION

Accordingly, the present invention relates to a micro-electro-mechanical device mounted on a substrate comprising:

a pivoting member having a first inner end and a first outer free end pivotally mounted above the substrate about a first pivoting axis;

a first electrode disposed below the pivoting member for actuation thereof;

wherein the first electrode includes a first portion beneath the first inner end of the pivoting member with a first force per unit area of the pivoting member, and a second portion beneath the first outer free end of the pivoting member with a second force per unit area of the pivoting member, which is less than the first force per unit area.

BRIEF DESCRIPTION OF THE DRAWINGS

The invention will be described in greater detail with reference to the accompanying drawings which represent preferred embodiments thereof, wherein.

DETAILED DESCRIPTION

Figure 1:
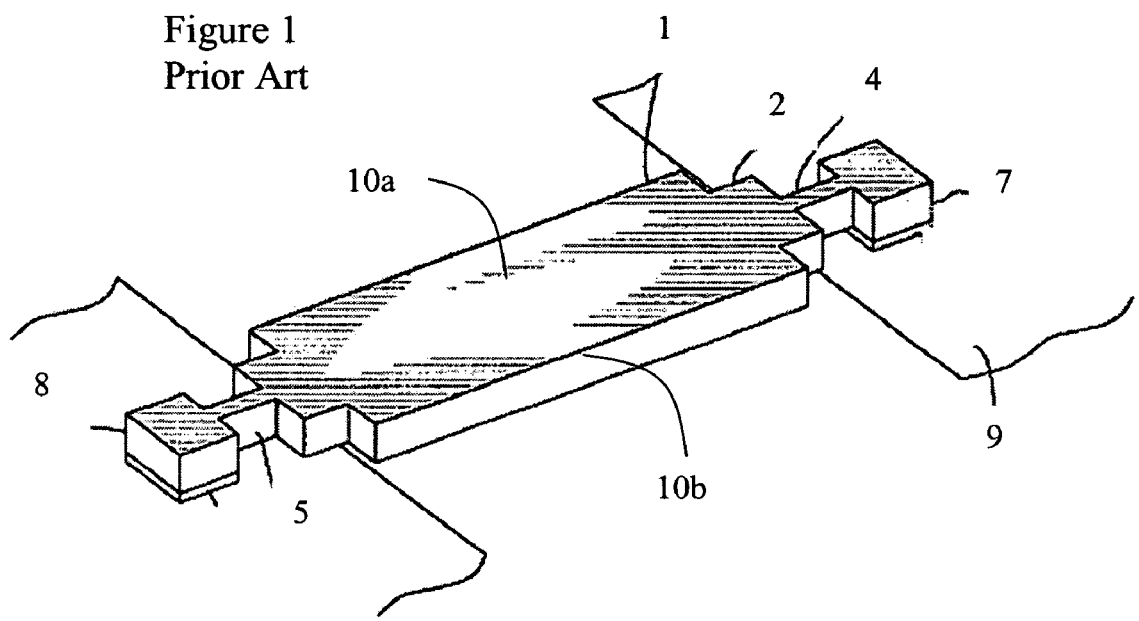
FIG. 1 is an isometric view of a conventional tilting MEMs mirror device.
Figure 2:
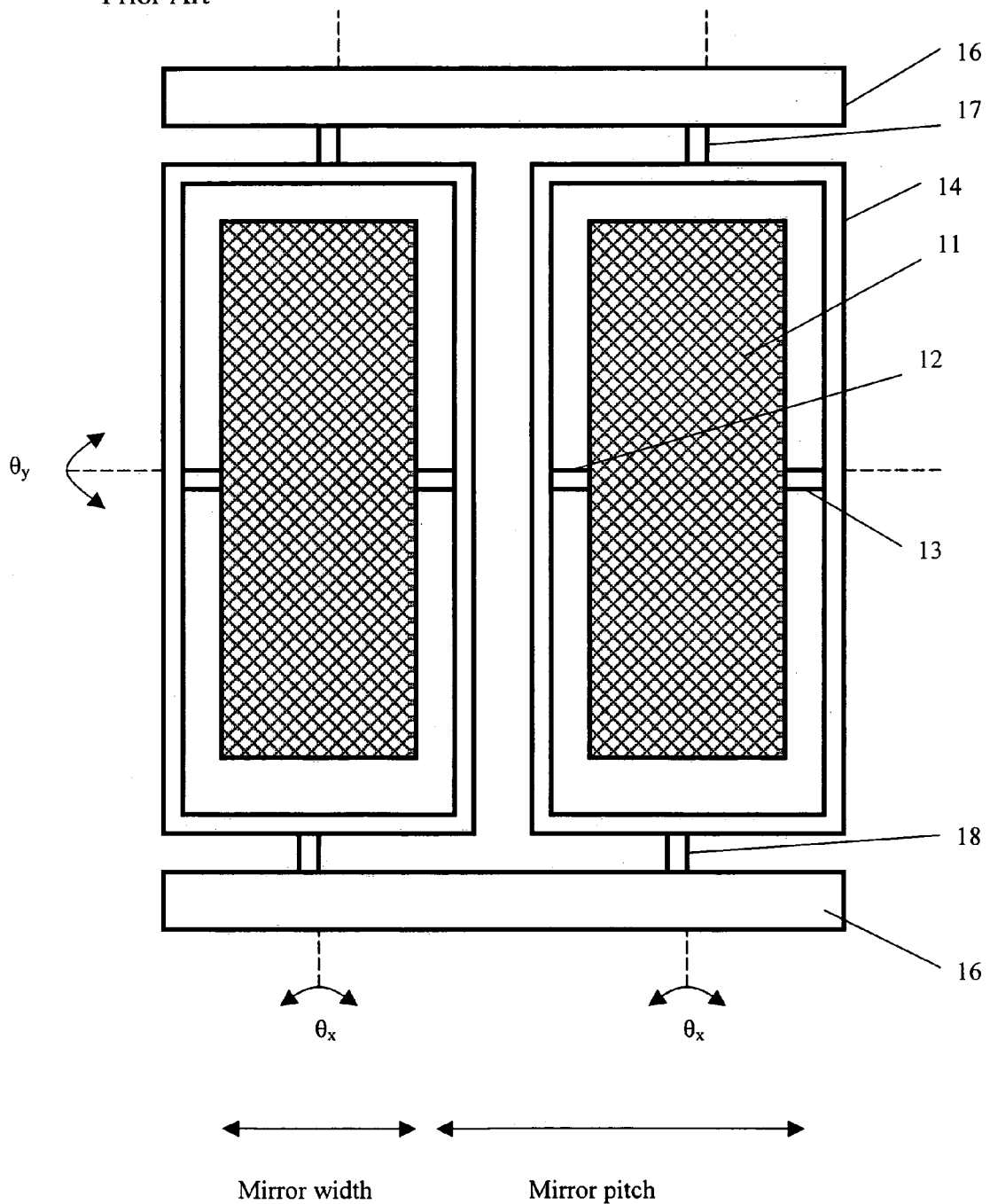
FIG. 2 is a plan view of a pair of conventional external gimbal ringMEMs mirror devices.
Figure 3:
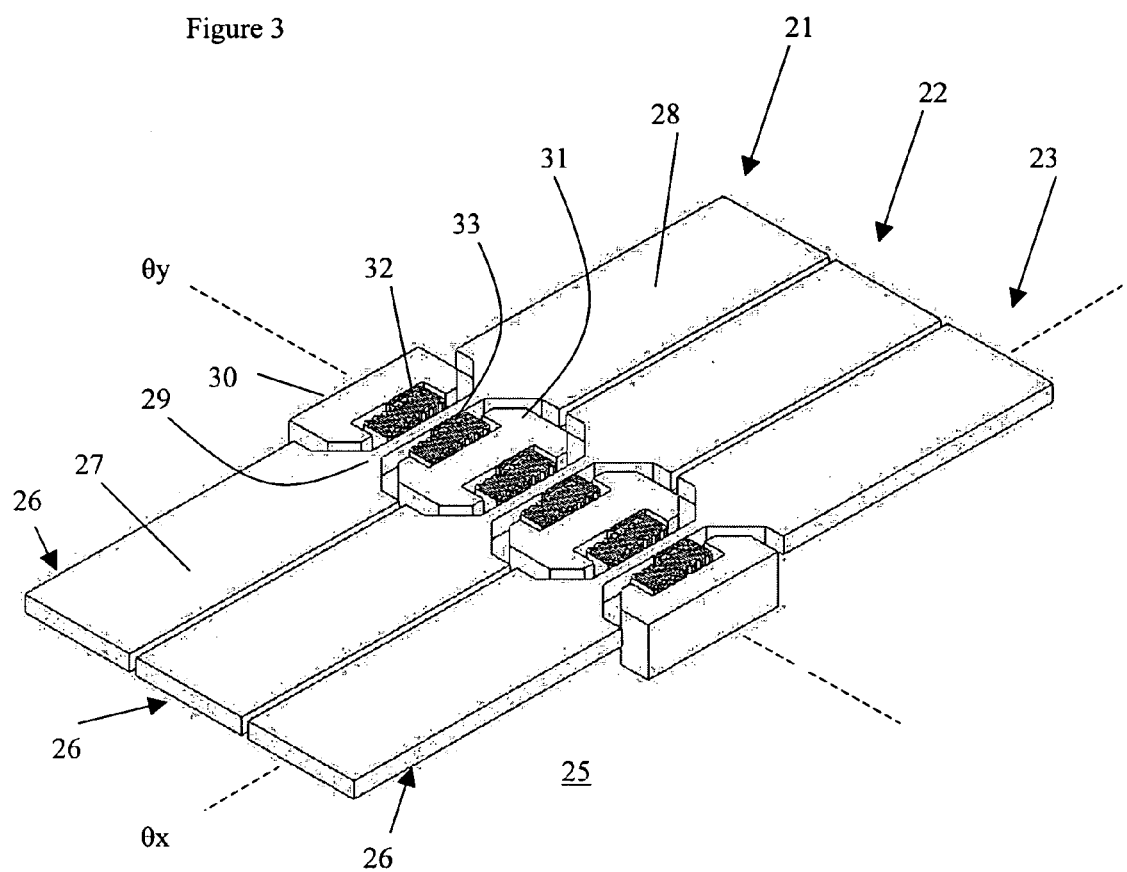
FIG. 3 is an isometric view of a plurality of Piano-MEMs mirror devices according to the present invention.
Figure 4:
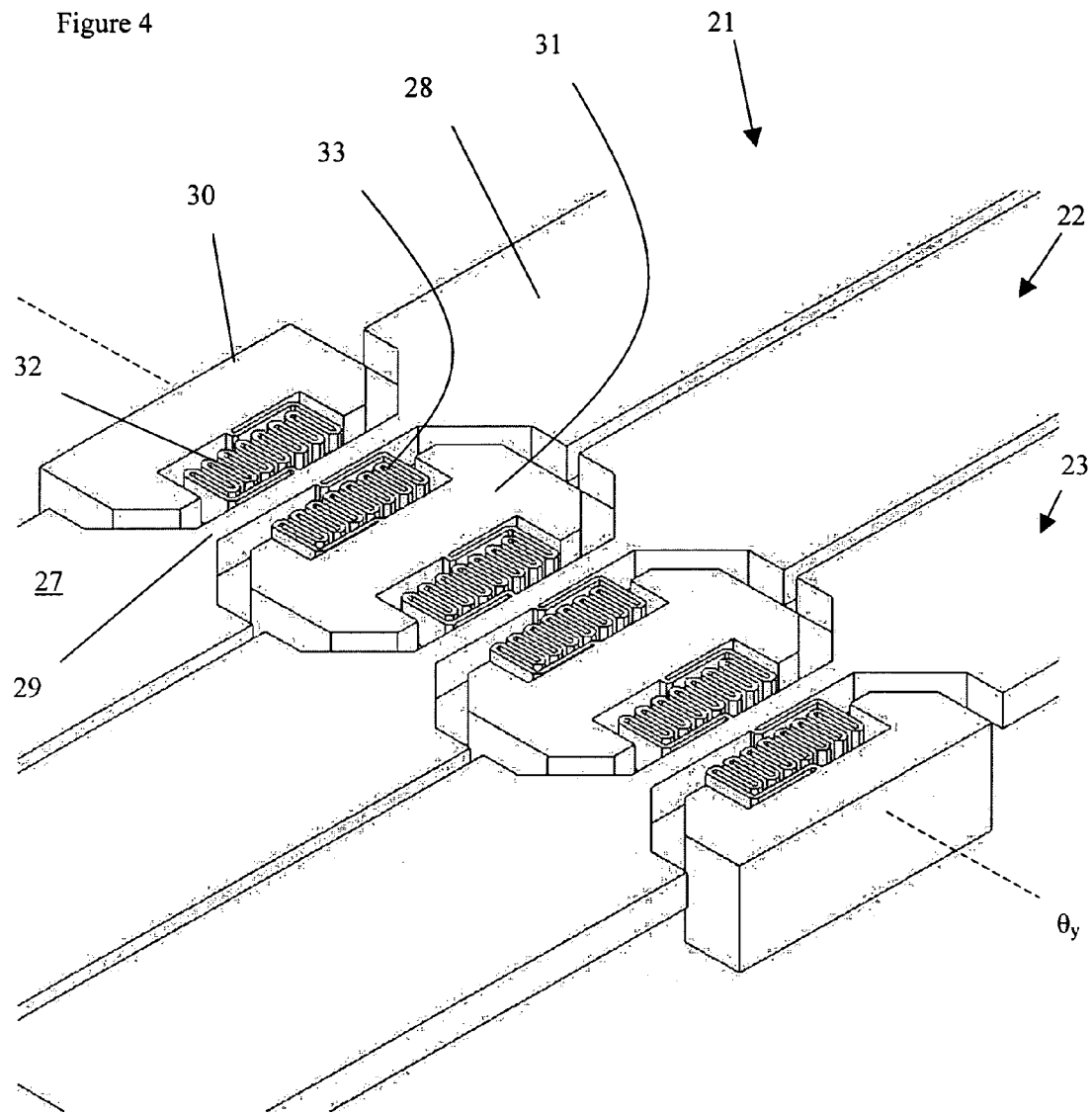
FIG. 4 is an isometric view of a hinge structure of the mirror devices of FIG. 3.

In accordance with the present invention an array of "Piano" MEMs mirror devices 21, 22 and 23, which pivot about a single axis of rotation $\theta_y$ above a substrate 25, is illustrated in FIGS. 3 and 4. Each mirror device 21, 22 and 23 includes a pivoting platform 26 defined by first and second substantially-rectangular planar supporting regions 27 and 28 joined by a relatively-thin substantially-rectangular brace 29 extending therebetween. Typically, each planar surface is coated with a reflective coating, e.g. gold, for simultaneously reflecting a pair of sub-beams of light traveling along parallel paths, as will be hereinafter discussed. Each brace 29 acts like a lever and is pivotally mounted on C or I-shaped anchor posts 30 and 31 via first and second torsional hinges 32 and 33, respectively. The anchor posts 30 and 31 extend upwardly from the substrate 25. The ends of the first torsional hinge 32 are connected to the anchor post 30 and the brace 29 along the axis $\theta_y$. Similarly, the ends of the second torsional hinge 33 are connected to the anchor post 31 and the brace 29 along the axis $\theta_y$. Preferably, each of the first and second torsional hinges 32 and 33 comprises a serpentine hinge, which are considerably more robust than conventional torsional beam hinges. The serpentine hinge is effectively longer than a normal torsional hinge, which spans the same distance, thereby providing greater deflection and strength, without requiring the space that would be needed to extend a normal full-length torsional hinge.

Figure 5:
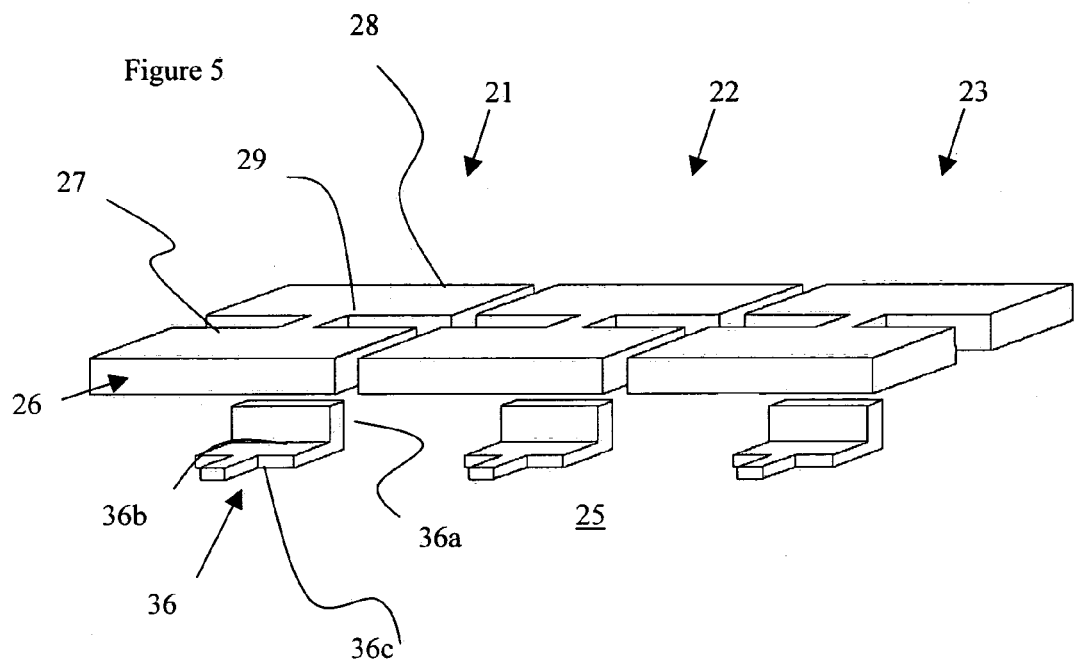
FIG. 5 is an isometric view of a plurality of Piano-MEMs mirror devices without shielding.
Figure 6:
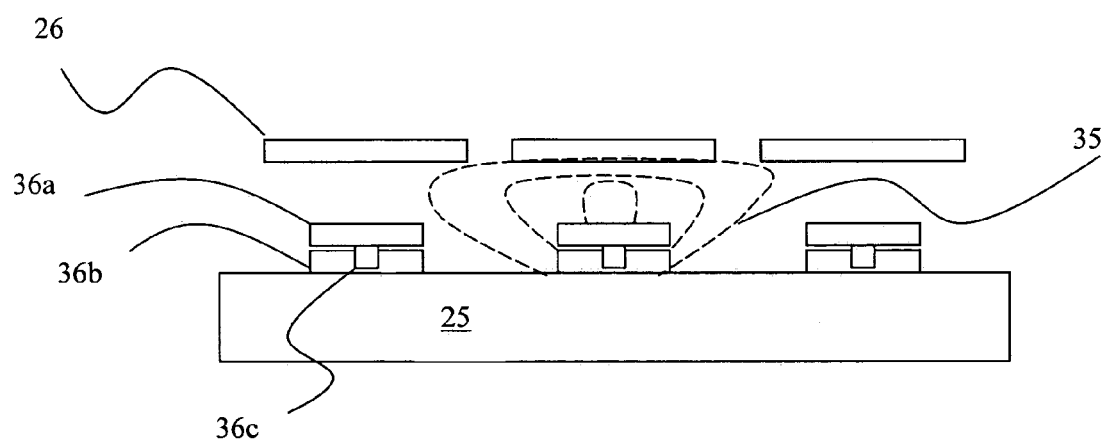
FIG. 6 is an end view of the mirror devices of FIG. 5.
Figure 9:
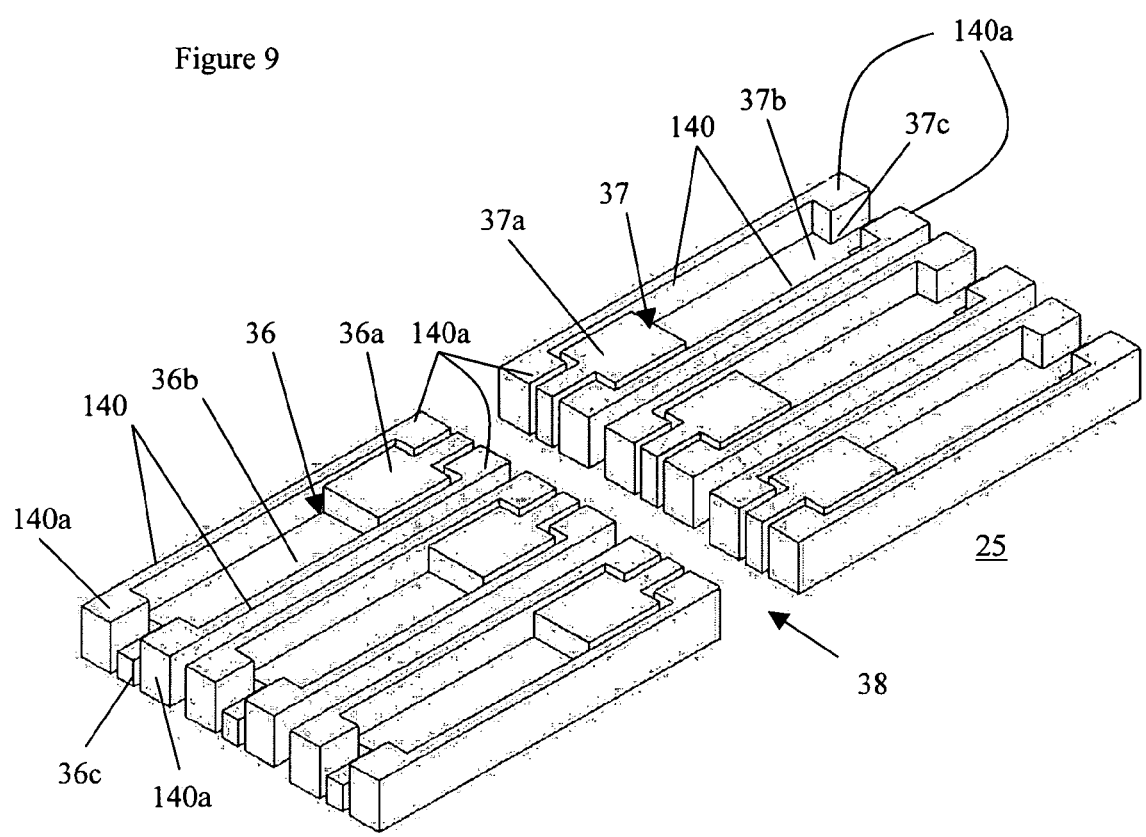
FIG. 9 is an isometric view of an alternative electrode structure of the mirror devices of FIGS. 3 and 4.

With particular reference to FIGS. 5 and 6, each platform 26 is rotated by the selective activation of a first electrode 36, which electro-statically attracts the first planar section 27 thereto or by the selective activation of a second electrode 37 (see FIG. 9), which electrostatically attracts the second planar section 28 thereto. A gap 38, illustrated in FIG. 9, is provided between the first and second electrodes 36 and 37 for receiving the anchor posts 31, which extend from the substrate 25 to adjacent the platforms 26.

Figure 7:
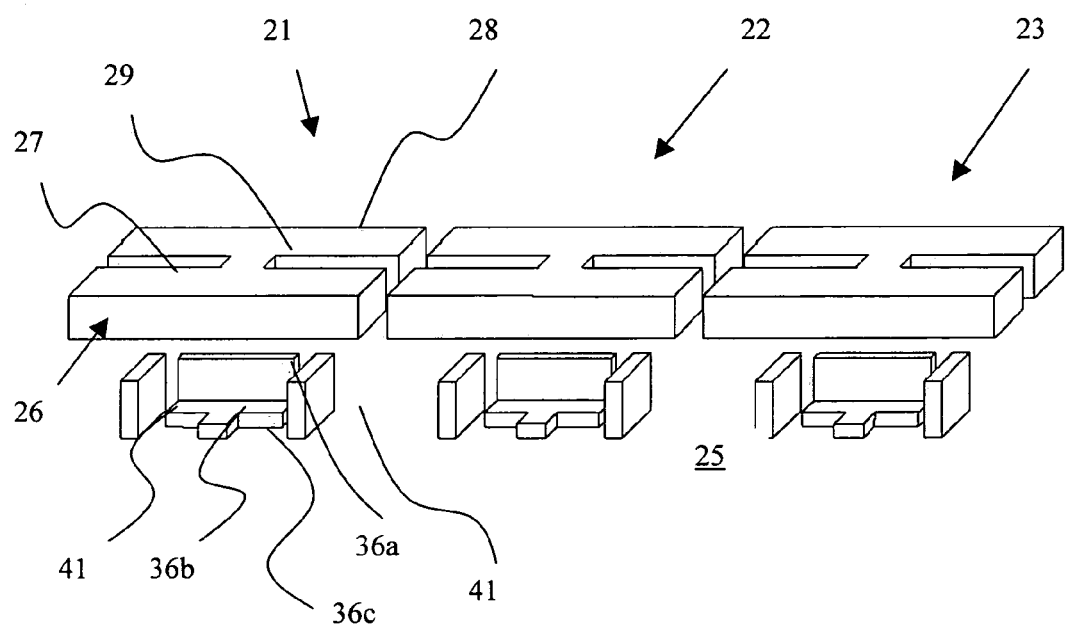
FIG. 7 is an isometric view of a plurality of Piano-MEMs mirror devices with electrodes according to the present invention with substrate shielding.
Figure 8:
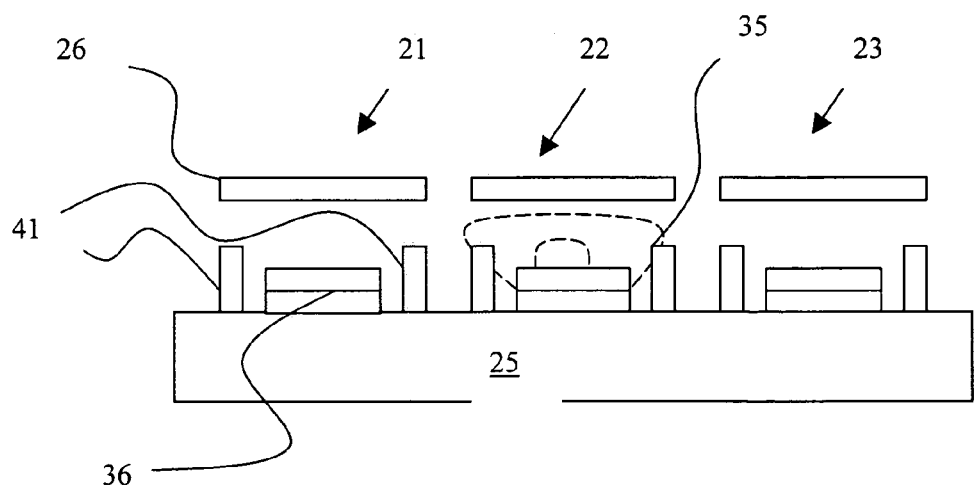
FIG. 8 is an end view of the mirror devices of FIG. 7.

A consequence of closely packed micro-mirrors is that the actuation of a single mirror will impart a torque, i.e. an angular rotation, onto adjacent mirrors as a result of fringing electric fields 35. In an effort to minimize this electrical cross-talk, electrode grounding shields 41, see FIGS. 7, 8 and 9, are positioned on the substrate 25 on either side of the first and second electrodes 36 and 37 forming electrode cavities, which are electrically isolated from each other. The electrode grounding shields 41 extend the length of the first and second electrodes 36 and 37, perpendicular to the axis of rotation $\theta_y$ of the platforms 26, defined by the gap 38. The walls of the electrode grounding shields 41 extend upwardly above the upper plane of the first and second electrodes 36 and 37. The grounding shields 41 are kept at ground potential, i.e. the same as the mirrored platforms 26, while one of the first and second electrodes is held at an activation voltage, e.g. 100 Volts.

In the disclosed open loop configuration, the angular position of the platforms 26 depend non-linearly on the voltage applied by the electrodes 36 (or 37), i.e. as the applied voltage is increased linearly, the incremental change in angular platform position is greater as the voltage increases. Accordingly, there is a maximum voltage, i.e. an angular platform position, at which the platform angular position becomes unstable and will uncontrollably tilt until hitting part of the lower structure, e.g. the electrode 36. This maximum voltage sets the range of angular motion that the platform 26 can travel. The instability in the platform's angular position is a result of the distance between the platform 26 and the electrode 36 (the hot electrode) decreasing more rapidly at the outer free ends of the platform 26 than at the inner sections, nearer the pivot axis $\theta_y$. As a result, the force per unit length along the platform 26 increases more rapidly at the outer free ends of the platform 26 than the inner sections. To increase the platform's range of angular motion, the field strength, i.e. the force per unit area, that is sensed at the outer free ends of the platform 26 must be reduced. With reference to FIGS. 5 to 9, this is accomplished by providing the electrodes 36 and 37 with a multi-step, e.g. a two step configuration. Upper steps 36a and 37a are positioned proximate the inner end of the platform 26, while lower steps 36b and 37b are positioned under the outer free ends of the platform 26, thereby making the gap between the platforms 26 and the electrodes 36 and 37 greater at the outer free end than the inner end. The surface area of the lower steps 36b and 37b can also be made smaller, thereby reducing the force per unit area sensed by the outer free end of the platform 26.

Trace lines 36c and 37c electrically connect the electrodes 36 and 37, respectively, to a voltage supply (not shown). Since the trace lines 36c and 37c also act as a hot electrode, i.e. contributing to the total torque applied to the platform 26, constructing them as thin as possible, i.e. with a minimal width from side to side and from top to bottom, also reduces the force applied to the outer free end of the platform 26.

FIG. 9 illustrates C-shaped grounding shields 140, which include lateral portions 140a for partially surrounding the electrode 36.

Figure 10:
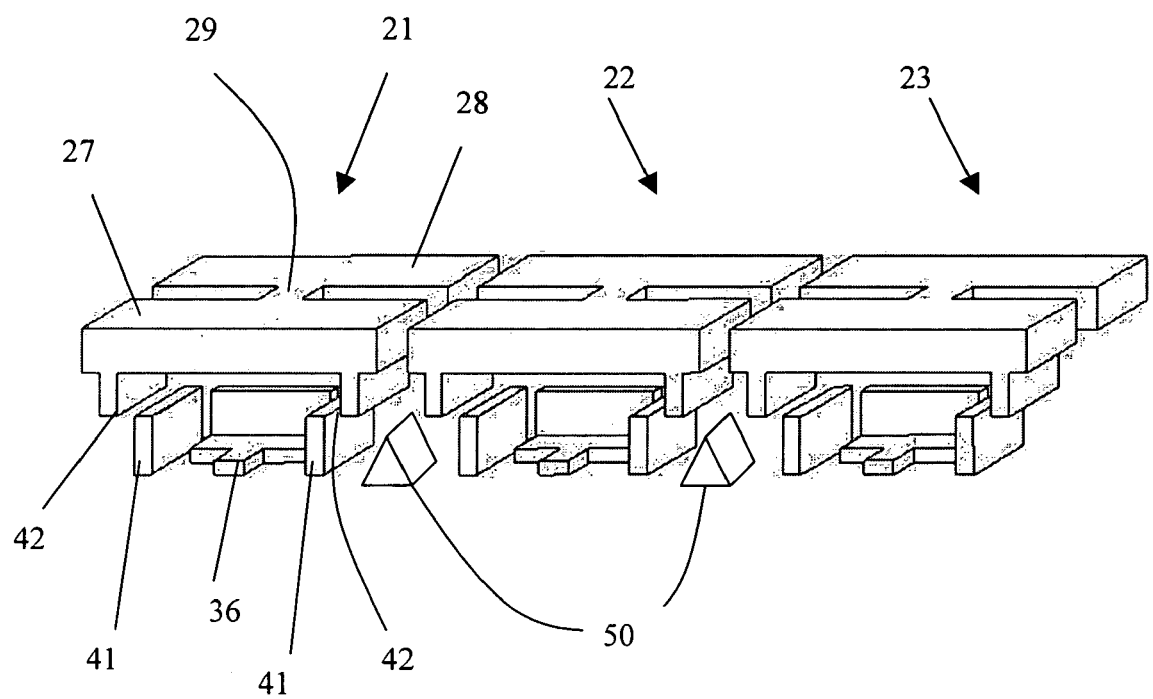
FIG. 10 is an isometric view of a plurality of Piano-MEMs mirror devices with electrodes according to the present invention with substrate and platform shielding.
Figure 11:
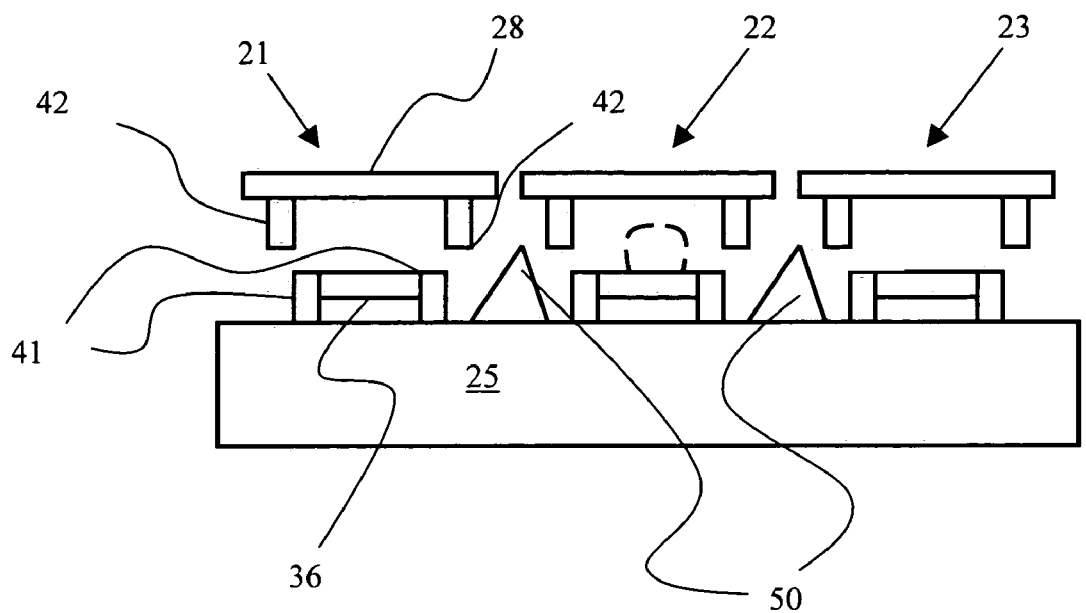
FIG. 11 is an end view of the mirror devices of FIG. 10.

To further eliminate cross-talk between adjacent electrodes 36, additional platform shields 42 (FIGS. 10, 11 and 12) can be added to the underside of the planar sections 27 and 28, outside or inside of the electrode shields 41. Typically, in the rest position, the two different sets of shields 41 and 42 are offset from each other and do not overlap; however, as the platform 26 tilts the platform shields 42 begin to overlap the grounding shielding 41. The added protection provided by overlapping shielding, is particularly advantageous, when the tilt angle of the platform 26 is proportional to the voltage applied to the electrode 36 (or 37), such as in open loop configurations. Accordingly, the greater the tilt angle, the greater the required voltage, and the greater the amount of potential cross-talk, but consequently the greater the amount of shielding provided by the overlapping ground and platform shields 41 and 42, respectively.

Since the MEMs mirror devices 21, 22 and 23 are for use in optical devices, i.e. wavelength blockers and multiple wavelength switches (see FIG. 18), which include a grating for dispersing the light into spectral wavelength component channels, it is an important performance requirement that the spectral response has a high rejection of light between the selected wavelength channels. Unfortunately, in conventional MEMs devices, light passes between the mirrors and is reflected off the substrate back into the optical device, thereby leading to a deterioration in the isolation between the wavelength channels. Accordingly, the present invention provides back reflection cusps 50, defined by angled, curved or concave reflecting surfaces intersecting along a ridge, extending longitudinally below the gap between the platforms 26, for scattering any light passing between the mirrored platforms 26 in a direction substantially parallel to the surface of the platforms 26.

Figure 12:
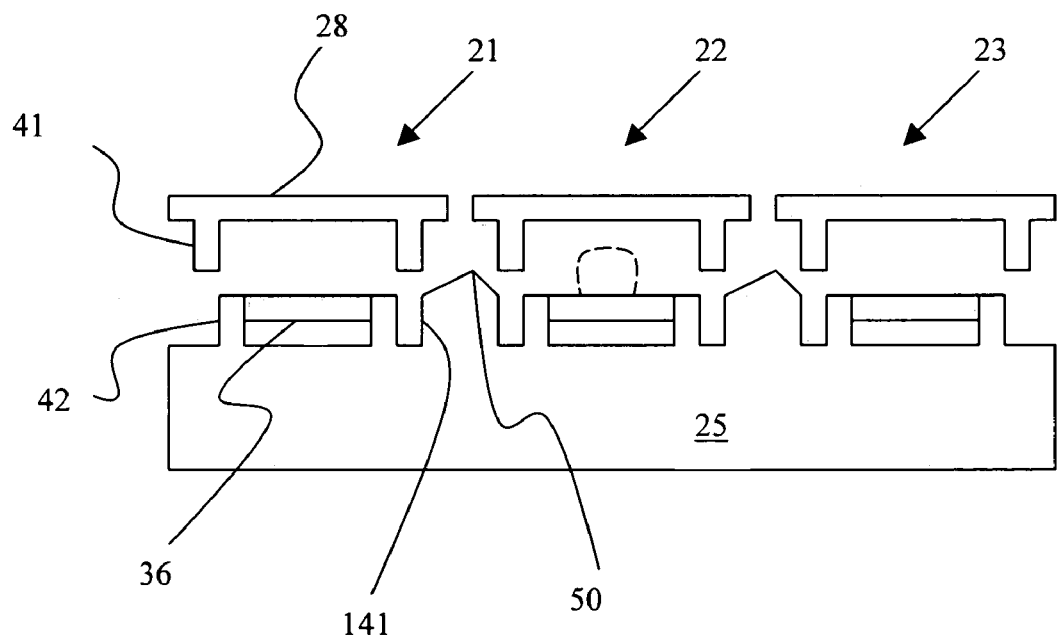
FIG. 12 is an end view of an alternative embodiment of the mirror devices of FIG. 10.

FIG. 12 illustrates a preferred embodiment in which the platform shields 42 are etched on the underside of the platforms 26, and the ground shields 41 are etched on the upper surface of the substrate 25. Trenches 45 are also etched from the upper surface of the substrate 25 for receiving the electrodes 36 and 37, while trenches 46 are etched from the upper surface of the substrate 25 to ensure the platform shields 42 have a free range of motion. Back reflection cusps 50 are provided on an additional ground shield 141 disposed between the platform shields 42 of adjacent platforms 26. When the additional ground shield 141 is provided, the original ground shields 41 can be eliminated.

Figure 13:
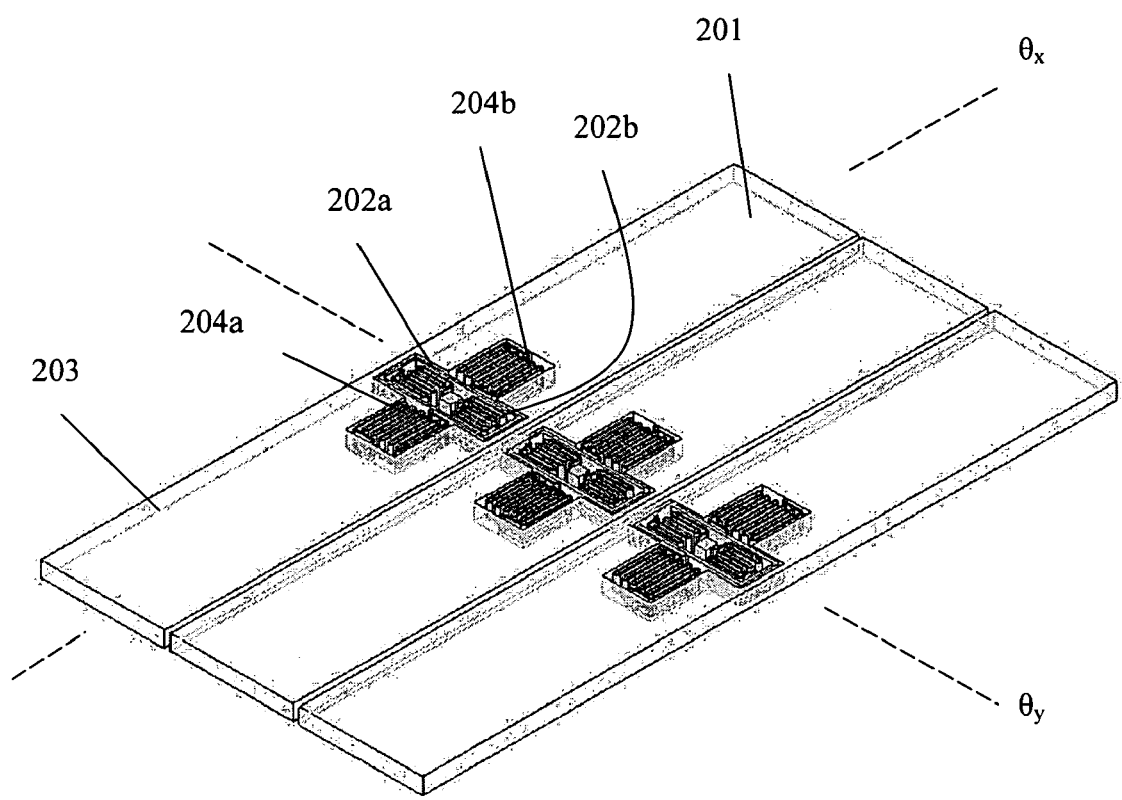
FIG. 13 is an isometric view of an internal gimbal ring MEMs mirror device according to the present invention.
Figure 14:
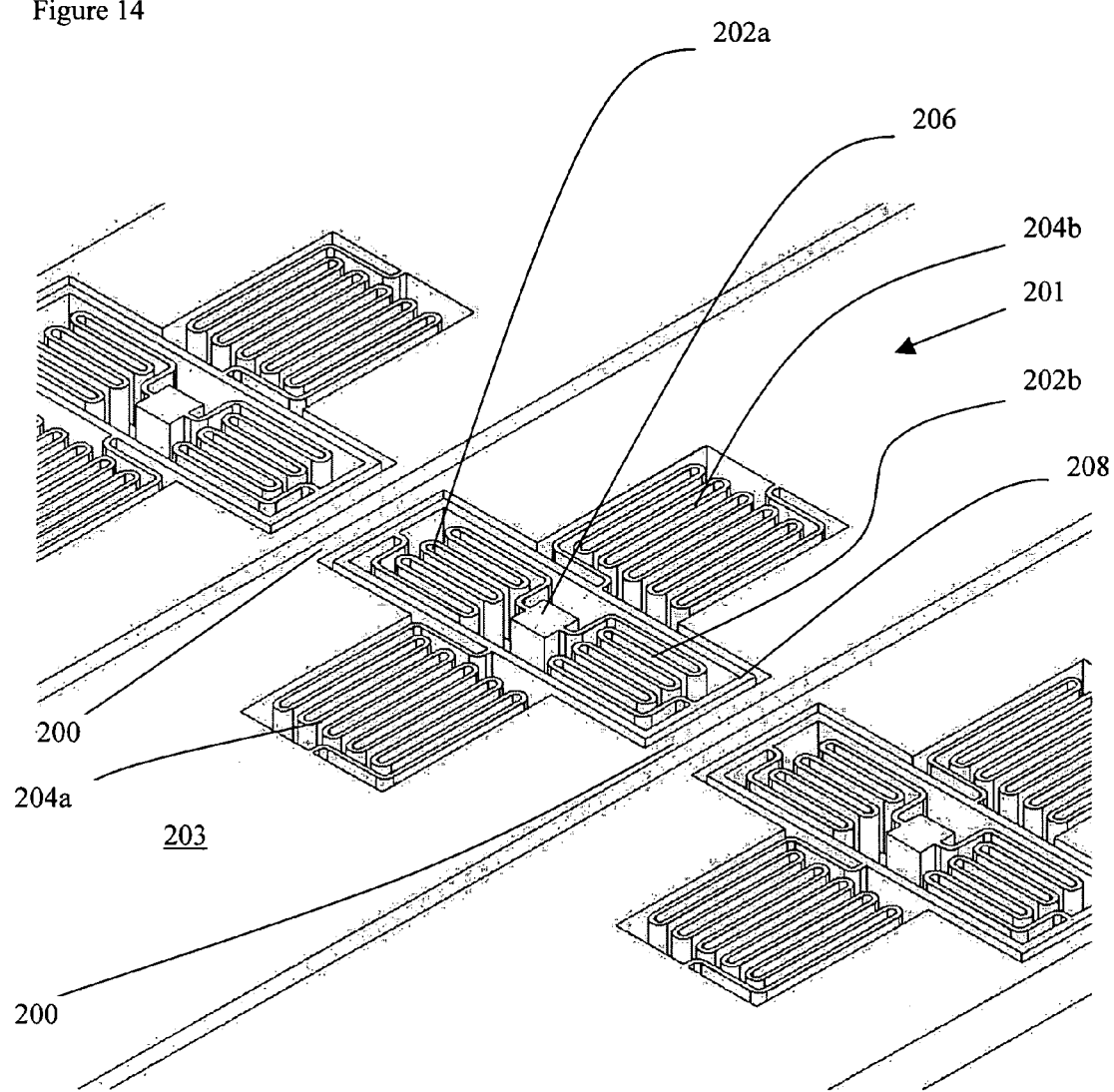
FIG. 14 is an isometric view of a hinge structure of the mirror devices of FIG. 13.

FIGS. 13 and 14 illustrate an array of internal gimbal ring MEMs mirror devices 201 utilizing a first pair of serpentine torsional hinges 202a and 202b for pivoting a rectangular platform 203 about a first axis of rotation $\theta_x$, and a second pair of serpentine torsional hinges 204a and 204b for rotating the platform 203 about a second axis of rotation $\theta_y$, above a base substrate 205. The first pair of serpentine torsional hinges 202a and 202b extend from a single anchor post 206, which extends upwardly from the base substrate 205 through the center of the platform 203, i.e. at the intersection of the minor and major axes thereof. Outer ends of the first pair of torsional serpentine torsional hinges 202a and 202b are connected to a rectangular gimbal ring 208, which surrounds the first pair of serpentine hinges 202 and 202b, at points along the minor axes ($\theta_y$) of the platform 203. The second pair of serpentine torsional hinges 204a and 204b extend from opposite sides of the gimbal ring 208 into contact with the platform 203, at points along the major axis ($\theta_x$) of the platform 203.

Figure 15:
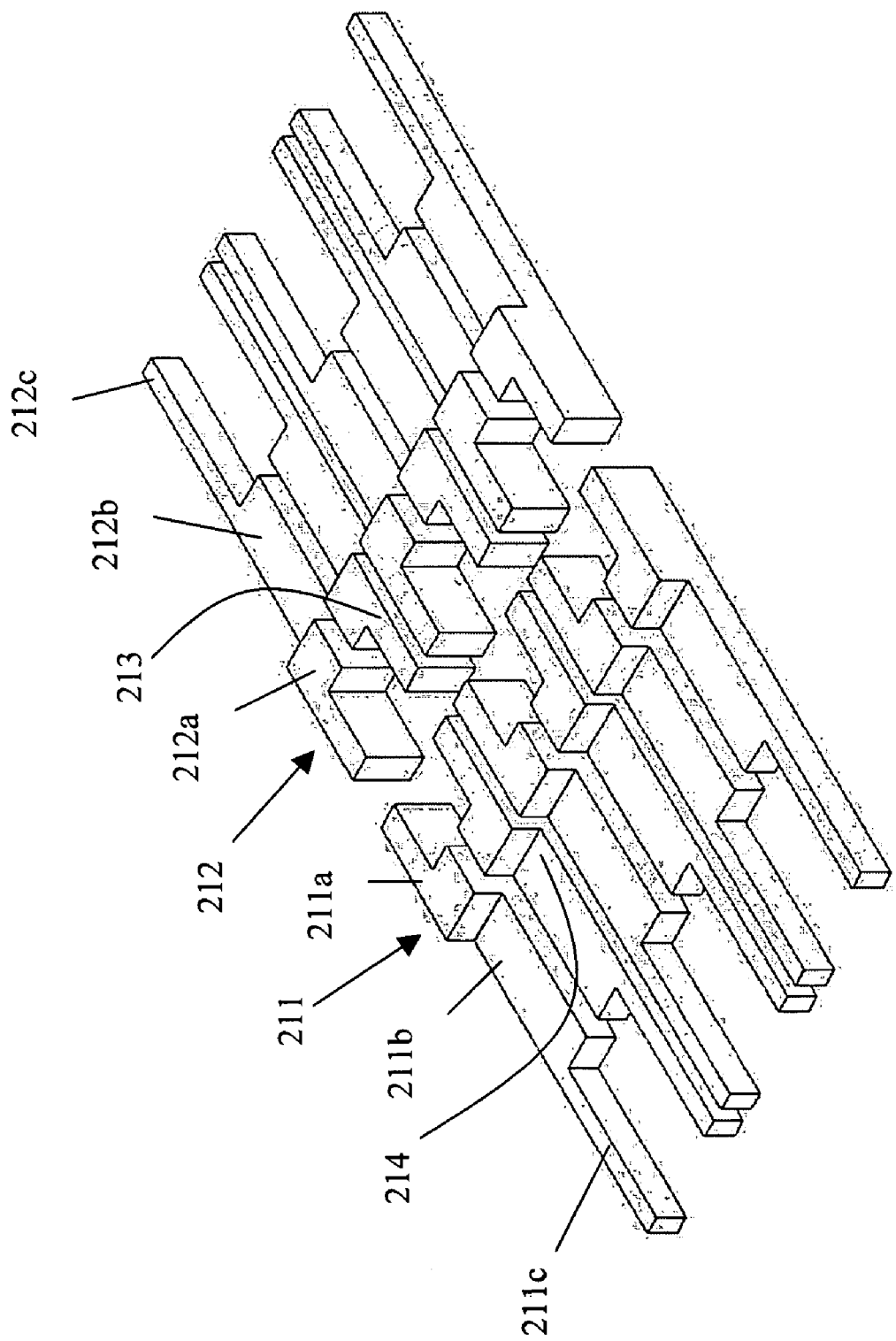
FIG. 15 is an isometric view of an electrode structure of the mirrordevices of FIGS. 13 and 14.
Figure 17:
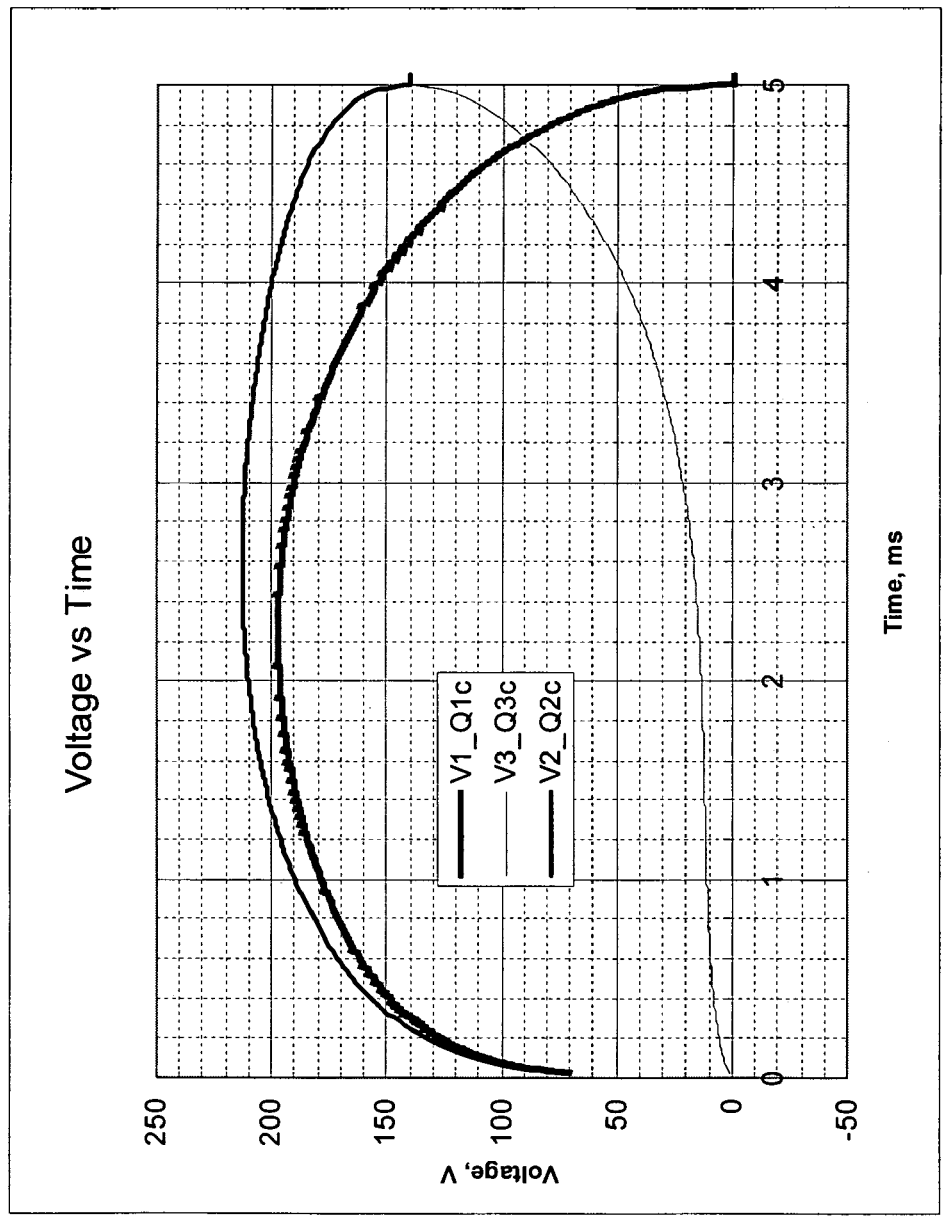
FIG. 17 is a graph of Voltage vs Time provided by the electrode structure of FIGS. 15 and 16.

To provide a full range of motion for the platform 203, a set of four two-step electrodes 211, 212, 213 and 214 are provided (See FIG. 15); however, for the present invention only the first, second and third electrodes 211, 212 and 213 are required to roll the mirrors out of alignment with any intermediate output ports and then back into alignment with a designated output port. Accordingly, first, second and third voltages can be established between the platform 203 and the first electrode 211, the second electrode 212 and the third electrode 213, respectively. Initially, the first and second electrodes 211 and 212 are activated to rotate the platform 203 about $\theta_x$. Subsequently, the first voltage is gradually lowered to zero, while the third voltage is gradually increased until it is equivalent to the second voltage (See FIG. 17). To minimize unwanted effected caused by ringing, i.e. vibration of the mirrors caused by an abrupt start or stop, the first, second and third voltages are increased gradually, as evidenced in FIG. 17, which illustrates the voltages curves for the various electrodes (first, second and third) over the actuation time of the mirror device. Various mirror tilting patterns can be designed based on the desired characteristics, e.g. attenuation, of the light.

Each electrode 211, 212, 213 and 214 has an upper step, e.g. 211a and 212a, a lower step, e.g. 211b and 212b, and a thin trace electrode, e.g. 211c and 212c, for reasons hereinbefore discussed.

Figure 16:
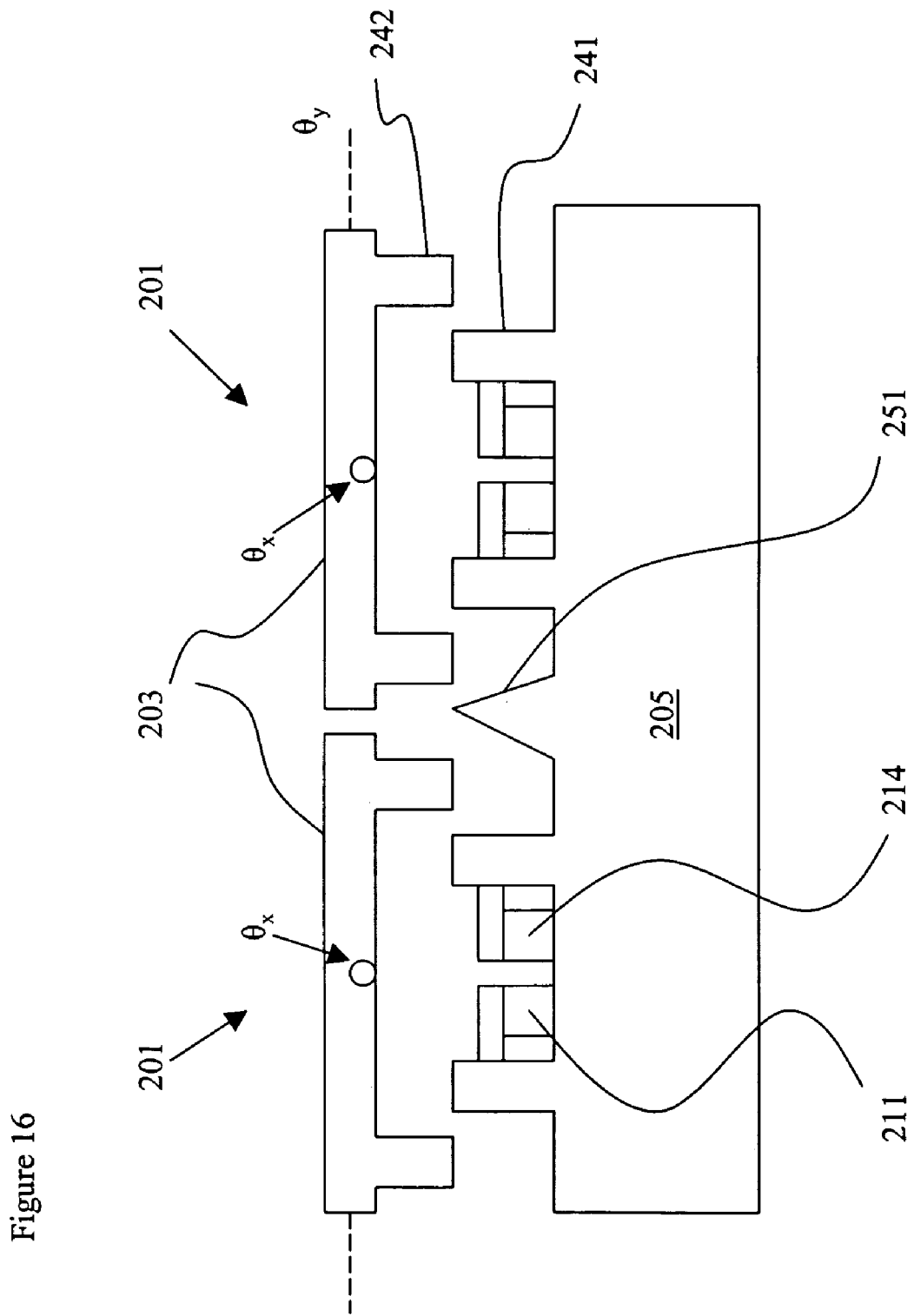
FIG. 16 is an end view of the internal gimbal ring MEMs mirror device of FIGS. 13 and 14.

FIG. 16 illustrates grounding shields 241 and platform shields 242, which minimize electrical cross-talk between the electrodes 211 to 214 of the internal gimbal ring MEMs mirror devices 201. Since the platforms 203 rotate about two axes, it is important to provide enough clearance between the grounding shields 241 and the platform shields 242 to prevent any contact therebetween during the full range of motion of the platform 203. A separate light reflecting cusp 251 is provided to reflect any light passing between the platforms 203 substantially parallel thereto, thereby preventing light from reflecting back between the mirrors and into the optics of the switch. Alternatively, the platform shields 242 could be omitted, whereby the cusp 251 would act as both shield and light reflector.

Figure 18:
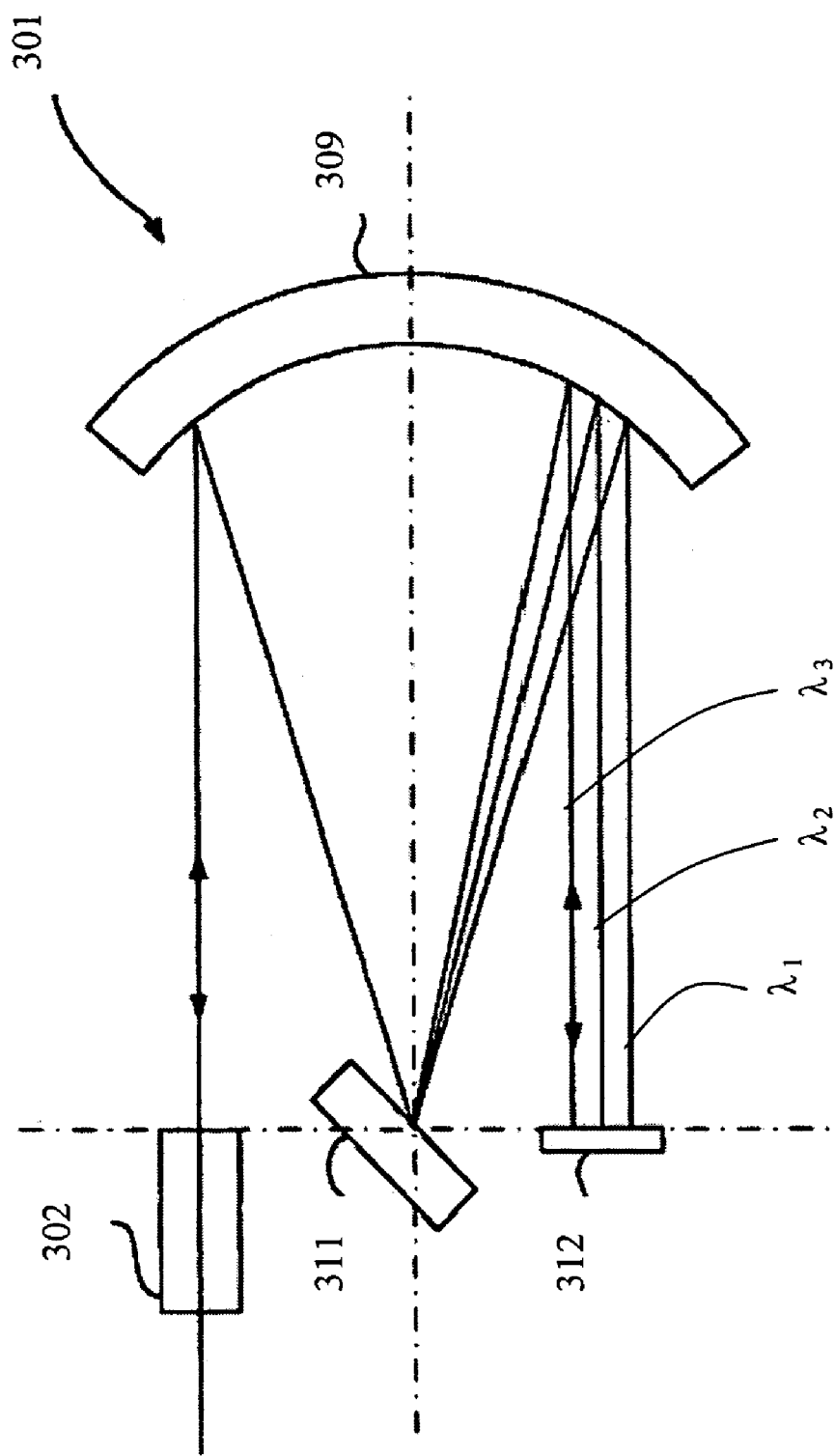
FIG. 18 is a schematic diagram of a wavelength switch utilizing the mirror devices of the present invention.
Figure 19:
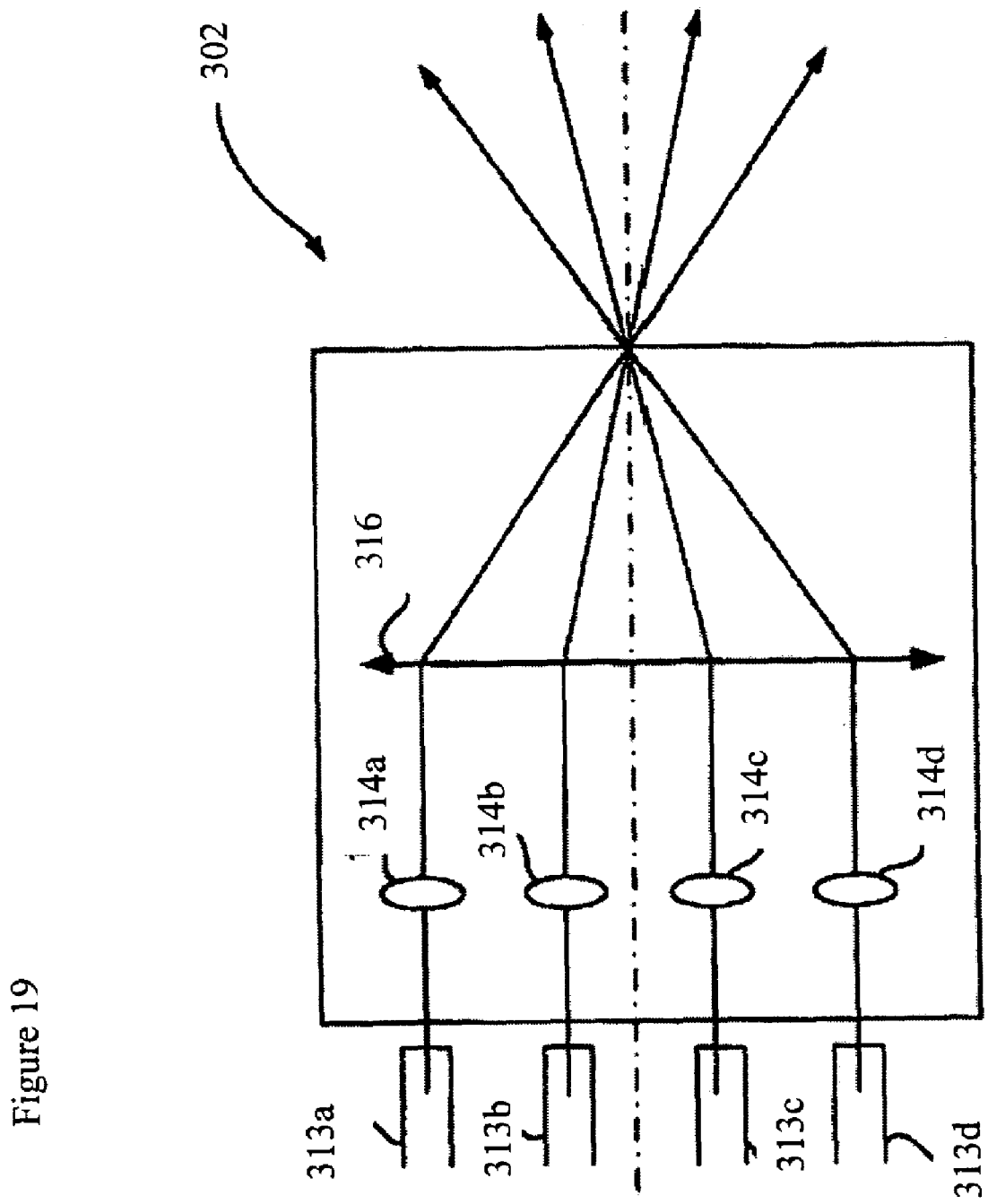
FIG. 19 is a schematic diagram of the input/output assembly for the wavelength switch of FIG. 18.
Figure 20:
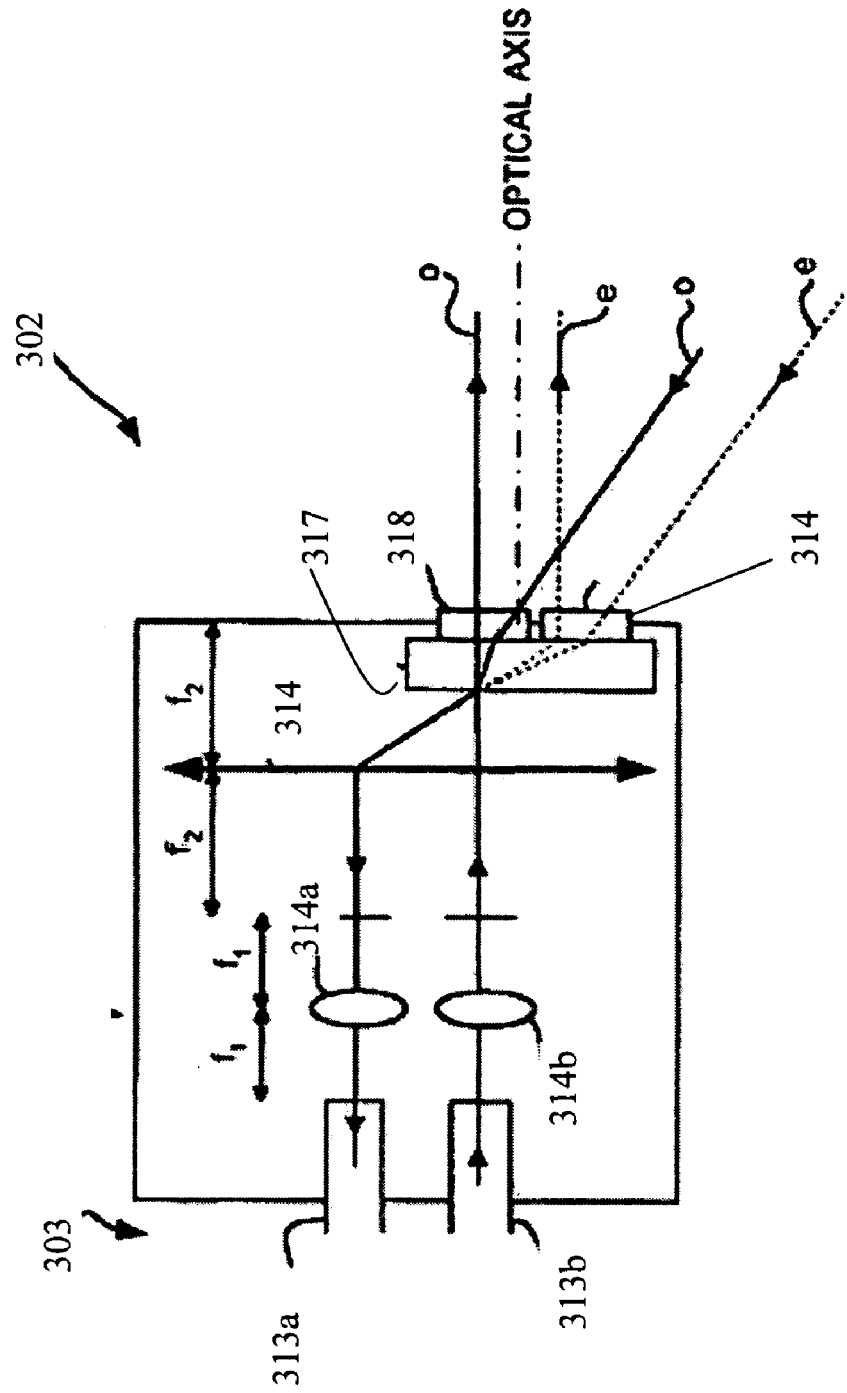
FIG. 20 is a schematic diagram of an alternative embodiment of an input assembly for the wavelength switch of FIG. 18.

The "piano" MEMs mirror devices according to the present invention are particularly useful in a wavelength switch 301 illustrated in FIGS. 18, 19 and 20. In operation, a beam of light with a plurality of different wavelength channels is launched via an input/output assembly 302, which comprises a plurality of input/output ports, e.g. first, second, third and fourth input/output ports 303, 304, 305 and 306, respectively. The beam is directed to an element having optical power, such as concave mirror 309, which redirects the beam to a dispersive element 311, e.g. a Bragg grating. The dispersive element separates the beam into the distinct wavelength channels ($\lambda_1$, $\lambda_2$, $\lambda_3$), which are again directed to an element having optical power, e.g. the concave mirror 309. The concave mirror 309 redirects the various wavelength channels to an array of "piano" MEMs mirror devices 312 according to the present invention, which are independently controlled to direct the various wavelength channels back to whichever input/output port is desired. Wavelength channels designated for the same port are reflected back off the concave mirror 309 to the dispersive element 311 for recombination and redirection off the concave mirror 309 to the desired input/output port. The concave mirror 309 can be replaced by a single lens with other elements of the switch on either side thereof or by a pair of lenses with the dispersive element 311 therebetween.

With particular reference to FIG. 19, the input/output assembly 302 includes a plurality of input/output fibers 313a to 313d with a corresponding collimating lens 314a to 314d. A single lens 316 is used to convert a spatial offset between the input/output ports into an angular offset. FIG. 20 illustrates a preferred embodiment of the input/output assembly, in which the unwanted effects of polarization diversity are eliminated by the use of a birefringent crystal 317 and a waveplate 318. For incoming beams, the lens 316 directs each beam through the birefringent crystal 317, which separates the beam into two orthogonally polarized sub-beams (o and e). The half waveplate 318 is positioned in the path of one of the sub-beams for rotating the polarization thereof by 90°, so that both of the sub-beams have the same polarization for transmission into the remainder of the switch. Alternatively, the waveplate 318 is a quarter waveplate and rotates one of the sub-beams by 45° in one direction, while another quarter waveplate 319 rotates the other sub-beam by 45° in the opposite direction, whereby both sub-beams have the same polarization. For outgoing light, the polarization of one (or both) of the similarly polarized sub-beams are rotated by the waveplate(s) 318 (and 319), so that the sub-beams become orthogonally polarized. The orthogonally polarized sub-beams are then recombined by the birefringent crystal 317 and output the appropriate input/output port. The micro-electro-mechanical devices according to the present invention are particularly well suited for use in switching devices with polarization diversity front ends, since they provide a pair of reflecting surfaces, i.e. one for each sub-beam.

We claim:

1. A micro-electro-mechanical device mounted on a substrate comprising:
   a pivoting member having a first inner end and a first outer free end pivotally mounted above the substrate about a first pivoting axis;
   a first electrode disposed below the pivoting member for actuation thereof;
   wherein the first electrode includes a first portion beneath the first inner end of the pivoting member with a first force per unit area of the pivoting member, and a second portion beneath the first outer free end of the pivoting member with a second force per unit area of the pivoting member, which is less than the first force per unit area.

2. The device according to claim 1, wherein first portion comprises a first step, and the second portion comprises a second step lower than the first step.

3. The device according to claim 2, wherein the second step includes an element with a width less than that of the first step.

4. The device according to claim 2, wherein the surface area of the second step is less than that of the first step.

5. The device according to claim 1, wherein the second portion includes an element with a width less than that of the first portion.

6. The device according to claim 1, wherein the surface area of the second portion is less than that of the first portion.

7. The device according to claim 1, wherein the pivoting member includes first and second supporting regions on opposite sides of the first pivoting axis, each supporting region having an inner end and an outer free end;
   wherein the first electrode is disposed under the first supporting region;
   wherein a second electrode is disposed under the second supporting region; and
   wherein the second electrode includes a first portion beneath the inner end of the second supporting region with a third force per unit area of the pivoting member, and a second portion beneath the outer free end of the second supporting region with a fourth force per unit area of the pivoting member, which is less than the third force per unit area.

8. The device according to claim 7, wherein the pivoting member includes:
   a brace means extending between the first and second supporting regions; and
   a first torsional hinge rotatable about the first pivoting axis extending between the brace means and an anchor post extending from the substrate.

9. The device according to claim 8, wherein the pivoting member further comprises:
   a gimbal ring surrounding the first torsional hinge, opposite ends of the first torsional hinge being fixed to opposite sides of the gimbal ring; and
   a second torsional hinge rotatable about a second pivot axis perpendicular to the first pivot axis, the second torsional hinge comprising first and second arms extending from opposite sides of the gimbal ring to the first and second supporting regions, respectively.

10. The device according to claim 9, further comprising:
    a third electrode positioned below the first supporting region adjacent the first electrode; and
    a fourth electrode positioned below the second supporting region adjacent the second electrode;
    wherein the third and fourth electrodes are for rotating the pivoting member about the second pivoting axis.

11. The device according to claim 10, wherein the third electrode includes a first portion beneath the inner end of the first supporting region with a fifth force per unit area of the pivoting member, and a second portion beneath the outer free end of the first supporting region with a sixth force per unit area of the pivoting member, which is less than the fifth force per unit area; and
    wherein the fourth electrode includes a first portion beneath the inner end of the second supporting region with a seventh force per unit area of the pivoting member, and a second portion beneath the outer free end of the second supporting region with a eighth force per unit area of the pivoting member, which is less than the seventh force per unit area.

12. The device according to claim 9, wherein said brace means includes a pair of braces extending between the first and second supporting regions on either side of the gimbal ring.

13. The device according to claim 7, wherein each of the first and second supporting regions include a reflective surface for redirecting light.

14. A micro-electro-mechanical device mounted on a substrate comprising;
    a plurality of platforms pivotally mounted above the substrate adjacent each other, and pivotable about the same or parallel axes, each platform having an inner end and an outer free end; and at least one electrode disposed beneath each of the platforms, wherein each electrode includes a first portion beneath the inner end of one of the platforms with a first force per unit area of the platform, and a second portion beneath the outer free end of one of the platforms with a second force per unit area of the platform, which is less than the first force per unit area.

15. The device according to claim 14, wherein first portion comprises a first step, and the second portion comprises a second step lower than the first step.

16. The device according to claim 15, wherein the second step includes an element with a width less than that of the first step.

17. The device according to claim 15, wherein the surface area of the second step is less than that of the first step.

18. The device according to claim 14, wherein the second portion includes an element with a width less than that of the first portion.

19. The device according to claim 14, wherein the surface area of the second portion is less than that of the first portion.

20. The device according to claim 14, further comprising shields on either side of each electrode beneath each platform for reducing cross-talk therebetween.

* * * * *